United States Patent [19]
Yokokura

[11] Patent Number: 5,241,498
[45] Date of Patent: Aug. 31, 1993

[54] NON-VOLATILE SEMICONDUCTOR MEMORY DEVICE

[75] Inventor: Seiichiro Yokokura, Tokyo, Japan

[73] Assignee: Kabushiki Kaisha Toshiba, Kawasaki, Japan

[21] Appl. No.: 547,795

[22] Filed: Jul. 3, 1990

[30] Foreign Application Priority Data

Jul. 5, 1989 [JP] Japan .................... 1-173558

[51] Int. Cl.$^5$ .............................................. G11C 11/34
[52] U.S. Cl. ..................... 365/185; 365/184
[58] Field of Search ............ 365/185, 226, 189.09, 365/184; 357/23.5

[56] References Cited

U.S. PATENT DOCUMENTS

| | | | |
|---|---|---|---|
| 4,203,158 | 5/1980 | Frohman-Bentchkowsky | 365/185 |
| 4,879,689 | 11/1989 | Atsumi | 365/185 |
| 4,930,105 | 5/1990 | Matsumoto | 365/185 |
| 5,010,520 | 4/1991 | Minagawa | 36/185 |
| 5,095,461 | 3/1992 | Miyakawa | 365/185 |

FOREIGN PATENT DOCUMENTS 0292895 11/1988 European Pat. Off. ............ 365/185

OTHER PUBLICATIONS

Maruyama, T., "Wide Operating Voltage Range and Low Power Consumption EEPROM Structure for Consumer Oriented ASIC Application", IEEE 1988 Custom IC Conference, pp. 4.1.1–4.1.4, N.Y., May 16–18, 1988.

*Primary Examiner*—Eugene R. LaRoche
*Assistant Examiner*—A. Zarahian
*Attorney, Agent, or Firm*—Finnegan, Henderson, Farabow, Garrett & Dunner

[57] ABSTRACT

There is a provided non-volatile semiconductor memory device including a memory cell including a source, a drain, a floating gate, and a control gate. To read out data from the memory cell, a voltage of not more than 2 V, obtained by decreasing an external power source voltage, is applied to the drain of the memory cell. Various constants of the memory cell are set so as to control an ON current to be not more than 300 μA when the memory cell is placed in an ON state while a threshold voltage of the memory cell is low.

10 Claims, 6 Drawing Sheets

NON-VOLATILE SEMICONDUCTOR MEMORY DEVICE

BACKGROUND OF THE INVENTION

1. Field of the Invention

The present invention relates to a non-volatile semiconductor memory device having memory cells constituted by non-volatile transistors.

2. Description of the Related Art

In a non-volatile semiconductor memory device (e.g., an EPROM or E²PROM) using a non-volatile transistor having a floating gate, occurrence of a change in threshold value of the memory cell transistor, which is called soft write, is known. It is known that this soft write has various modes. Typical soft write modes are a hot electron mode and a lucky electron mode.

In a conventional non-volatile semiconductor memory device, since only soft write in the hot electron mode receives attention, occurrence of soft write is prevented by setting a drain voltage of a memory cell at a value of about 2 V.

In recent years, however, it has been found that soft write occurs even when the drain voltage of the memory cell is set at about 2 V. It is also found that the soft write is caused by the above lucky electron mode.

SUMMARY OF THE INVENTION

It is, therefore, an object of the present invention to provide a non-volatile semiconductor memory device capable of decreasing occurrence of soft write compared with a conventional device.

According to the present invention, there is provided a non-volatile semiconductor memory device comprising a memory cell constituted by a non-volatile transistor having source and drain regions, a channel region located between the source and drain regions, a first insulating film formed in the channel region, a floating gate formed on the first gate insulating film, a second gate insulating film formed on the floating gate, and a control gate formed on the second gate insulating film, a first circuit means for receiving external power source voltage of not less than 2 V and decreasing the external power source voltage to obtain a voltage of not more than 2 V and for applying the voltage of not more than 2 V to the drain region of the memory cell during reading data from the memory cell, and a second circuit means for applying a predetermined read voltage to the control gate during reading data from the memory cell, wherein, in the memory cell, when the voltage of not more than 2 V and the read voltage output from the second circuit means are applied to the drain region and the control gate, respectively, various constants are set to control an ON current to be not more than 300 μA.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
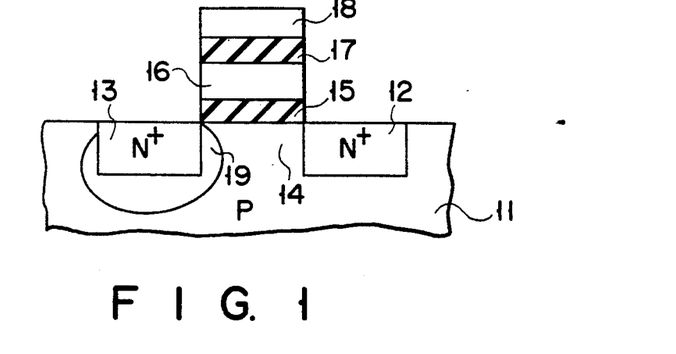
FIG. 1 is a sectional view showing an element arrangement of a memory cell used in an EPROM according to the present invention.

In a memory cell shown in FIG. 1, reference numeral 11 denotes, e.g., a P-type silicon semiconductor substrate; 12, an N⁺-type source region; 13, an N⁺-type drain region; 14, a channel region located between the source and drain regions; 15, a first gate insulating film constituted by a silicon oxide film formed in the channel region 14; 16, a floating gate formed on the first gate insulating film 15 and constituted by a first polysilicon layer; 17, a second gate insulating film constituted by a silicon oxide film formed on the floating gate 16; and 18, a control gate formed on the second gate insulating film 17 and constituted by a second polysilicon layer.

In the hot electron mode as one soft write mode, a threshold voltage is changed as follows. That is, predetermined voltages are applied to the control gate 18 and the drain region 13 during reading data. At this time, when the memory cell threshold voltage is low and an N-type inverting layer is formed in the channel region 14 and set in an ON state, electrons generated from the source region 12 are accelerated by an electric field of a depletion layer 19 formed in the substrate contacting the drain region 13. Therefore, the electrons are trapped by the floating gate 16. As a result, the threshold voltage is changed.

In the lucky electron mode, as another soft write mode, before electrons generated from the source region 12 reach the drain region 13, the electrons are trapped in the floating gate 16 by an electric field generated by a voltage applied to the control gate 18. As a result, a threshold voltage is changed.

A change $\Delta V_{TH}$ in threshold voltage of the memory cell in the hot electron mode is proportional to a value of $A\exp(-\beta/V_D)$, where $A$ and $\beta$ represent constants, and $V_D$ represents the drain voltage of the memory cell.

However, a change in threshold voltage of the memory cell in the lucky electron mode is generally considered to depend on the ON current of the memory cell and the control gate voltage.

Figure 2:
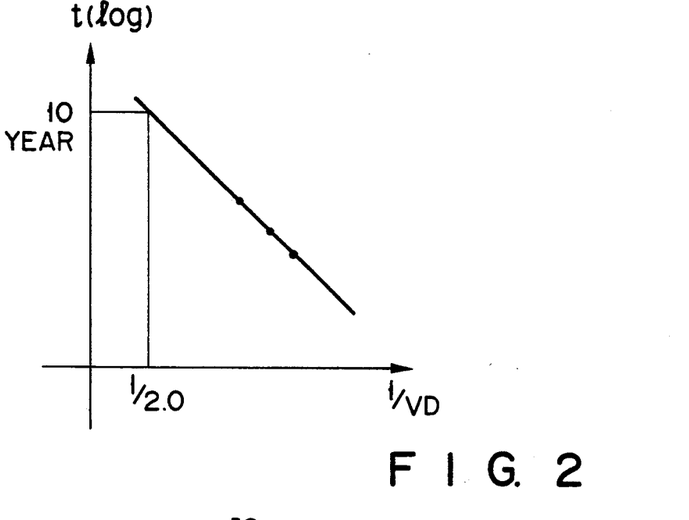
FIG. 2 is a graph used for evaluating soft write in the hot electron mode.

The soft write in the hot electron mode is evaluated as follows. For example, as shown in the graph of FIG. 2, a reciprocal of the drain voltage (1/VD) is plotted along the abscissa, and time t (log representation) required for a change in voltage of 0.1 V of the threshold voltage of the memory cell is plotted along the ordinate. The value (1/VD) corresponding to 10 years is read according to these characteristics to define the value of the drain voltage VD. In a typical EPROM, the value (1/VD) is about 1/2.0. It is understood that the value of the drain voltage VD free from soft write is about 2.0 V.

Figure 3:
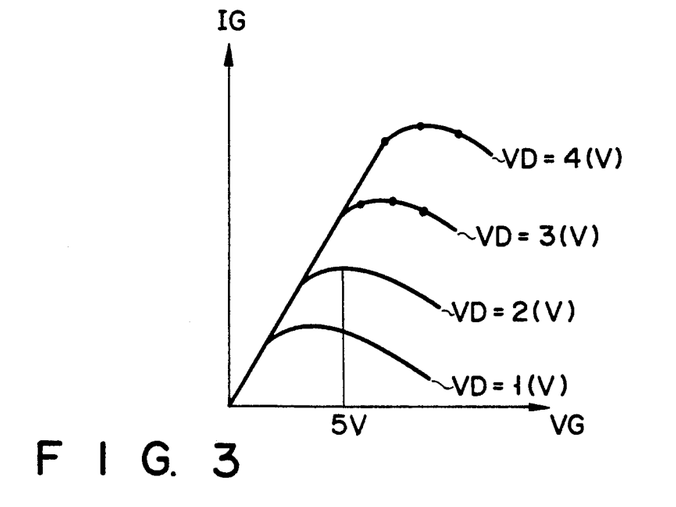
FIG. 3 is a graph showing a result obtained by converting current of hot electrons in a hot electron mode.

As shown in the graph in FIG. 3, an amount IG obtained by converting a current of hot electrons has a peak value with respect to a control gate voltage VCG When the drain voltage VD is 2.0 V, the amount IG has a peak value for the VCG of about 5 V. Therefore, when the VCG is about 5 V or more, the IG is the peak value or less, thereby weakening the soft write. However, eve when the drain voltage VD is set at a value of about 2.0 V, soft write occurs.

In a non-volatile semiconductor memory device according to the present invention, not only soft write in the hot electron mode but a change in threshold voltage of a memory cell in the lucky electron mode are considered. The embodiment of the present invention will be described below with reference to the accompanying drawings.

Figure 4:
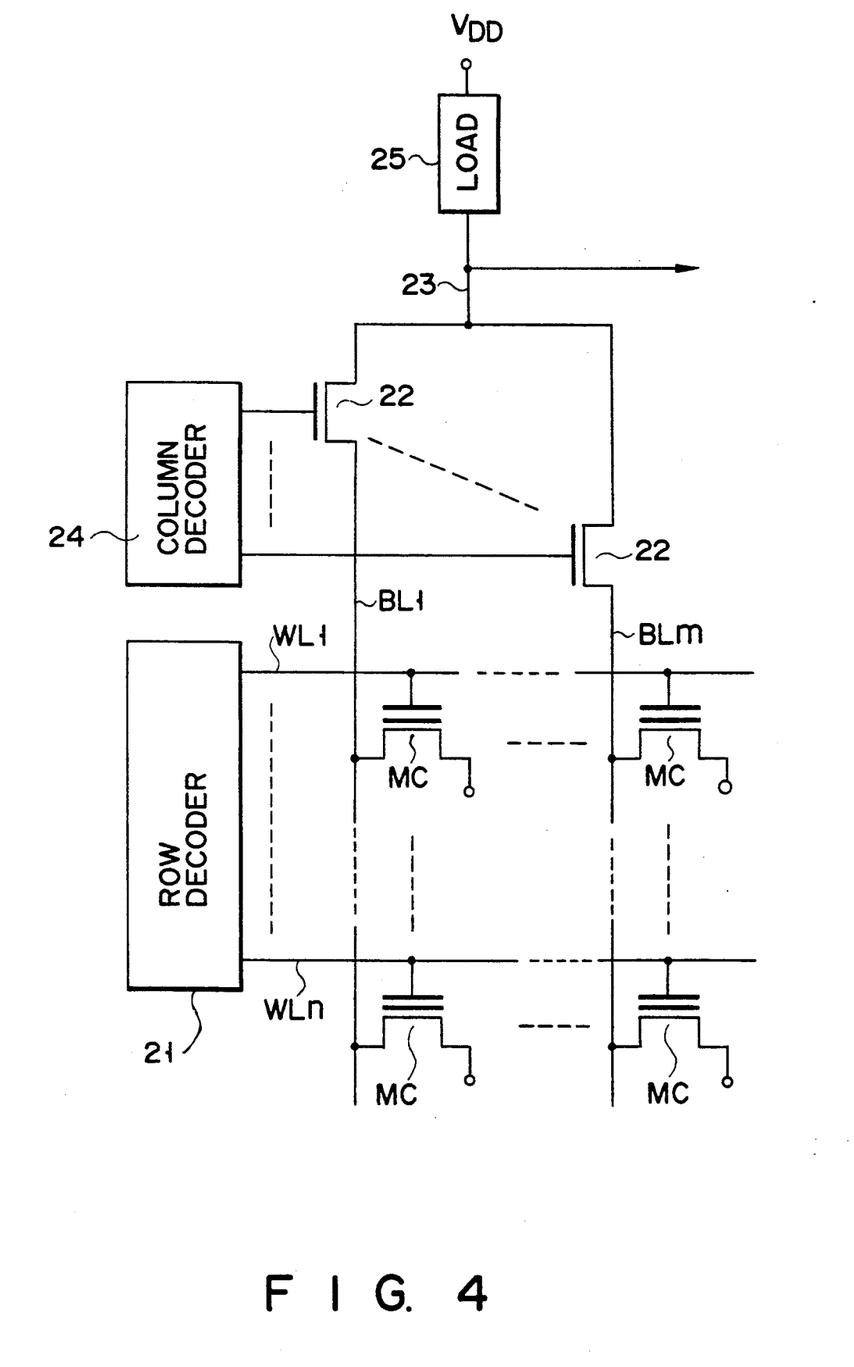
FIG. 4 is a circuit diagram showing a circuit arrangement of a device according to the first embodiment of the present invention.

FIG. 4 is a circuit diagram showing an arrangement of a data read circuit when the present invention is applied to an EPROM. Note that, in FIG. 4, a data write circuit is omitted. Referring to FIG. 4, reference symbols WL1 to WLn denote word lines and reference symbols BL1 to BLm denote bit lines. Reference symbol MC denotes a memory cell constituted by a non-volatile transistor having the element arrangement shown in FIG. 1. The control gate of each memory cell MC is connected to the corresponding one of the word lines WL1 to WLn, the drain of each memory cell MC is connected to the corresponding one of the plurality of bit lines BL1 to BLm, and a predetermined voltage is commonly applied to the source of each memory cell MC. The plurality of word lines WL1 to WLn are selectively driven by an output from a row decoder 21. The plurality of bit lines BL1 to BLm are connected to a date detecting node 23 through column selection MOS transistors 22, 22, . . . , respectively. Each of the column selection MOS transistors 22, 22, . . . is selectively driven in accordance with an output from a column decoder 24. A load element 25 is connected between the node 23 and an application point of an external power source voltage VDD.

Figure 5:
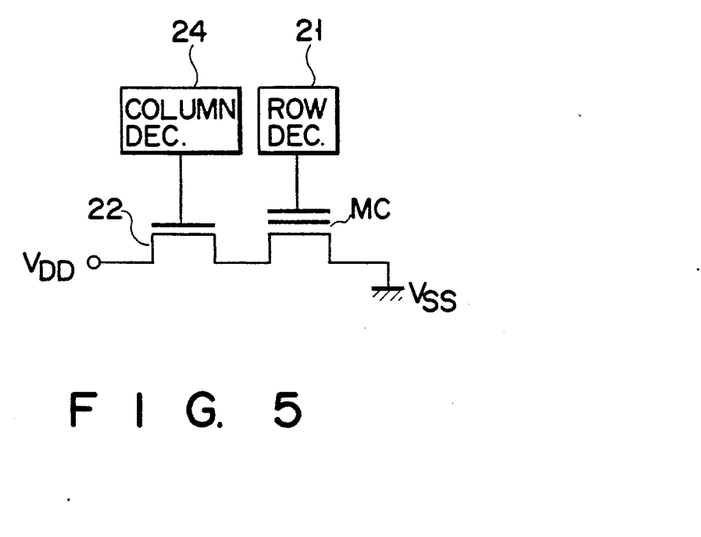
FIG. 5 is a circuit diagram showing a circuit of a part of one memory cell in the circuit according to the first embodiment.

FIG. 5 shows a circuit of a part concerning one memory cell in the EPROM in FIG. 4. In FIG. 5, the ground voltage VSS of, e.g, 0 V is applied to the source of a memory cell MC constituted by a non-volatile transistor. The external power source voltage VDD connected to drain of the memory cell MC through the column selection MOS transistor 22 is set at, e.g., 5 V.

The column decoder 24 for selectively driving the column selection MOS transistors 22 during reading data generates a voltage of, e.g., 2 V by decreasing the external power source voltage VDD of 5 V. Therefore, each column selection MOS transistor 22 is selected by the column decoder 24, and a voltage of about 2 V is applied to the drain of the corresponding memory cell MC when a voltage of 2 V is applied to the gate of this MOS transistor 22. During reading or writing data, a voltage having a predetermined value is applied to the control gate of the memory cell MC in accordance with an output from the row decoder 21. During reading data, the threshold value of the memory cell MC is set at a low voltage in advance, various constants of the memory cell MC are set to supply an ON current of about 300 $\mu$A to the memory cell MC when the memory cell MC is set in an ON state. For example, in each memory cell MC, the P-type silicon substrate 11 having a surface impurity concentration of $1.3 \times 10^{15}$ atoms/cm$^2$ is used, and boron ($^{11}$B$^+$) ions are implanted in the channel region 14 at an acceleration voltage of 100 keV and a dose of $2.5 \times 10^{12}$ atoms/cm$^2$. The diffusion depth Xj of each of the N$^+$-type source and drain regions 12 and 13 is set to 0.25 $\mu$m, the surface impurity concentration of each of the source and drain regions 12 and 13 is set to $4 \times 10^{20}$ atoms/cm$^2$, the resistivity of each of the source and drain regions 12 and 13 is set to $40 \pm 5$ $\Omega \cdot$cm, the resistance of the floating gate 16 is set at $40 \pm 5$ $\Omega \cdot$cm, the thickness of the first gate insulating film 15 is 250 Å, the thickness of the second gate insulating film 17 is set to 500 Å, a capacitance coupling ratio of the floating gate 16 and the control gate 18 is set to 2, a channel width W is set to 1.2 $\mu$m, and a channel length L is set to 1.5 $\mu$m. In this manner, the respective constants are set. In this case, a threshold voltage VTH of the memory cell is about 2 V.

A value of the ON current Icell measured when a memory cell has the above structure and is set in an ON state is generally calculated by the following equation:

$$Icell = (\tfrac{1}{2}) \cdot (W/L) \cdot (\mu n/tox) \cdot (VFG - VTH)^2$$

where $\mu n$ represents electron mobility and is calculated by the equation $\mu n = \epsilon ox \cdot \epsilon o \cdot \mu$. At this time, assume that a dielectric constant $\epsilon ox$ of a silicon oxide film is 4, a specific dielectric constant $\epsilon o$ is $8.85 \times 10^{-4}$ Q/V·cm, and $\mu$ is 285 cm$^2$/V·sec. In addition, the symbol VFG represents the floating gate voltage, and this voltage is set to about 4.67 V in accordance with a capacitance coupling ratio of 2 of a voltage VCG applied to the control gate and the floating gate. The symbol tox represents the thickness of the first gate insulating film 15.

An ON current value of the memory cell in an ON state is calculated by the equation of the ON current Icell to be about 180 $\mu$A.

Figure 6:
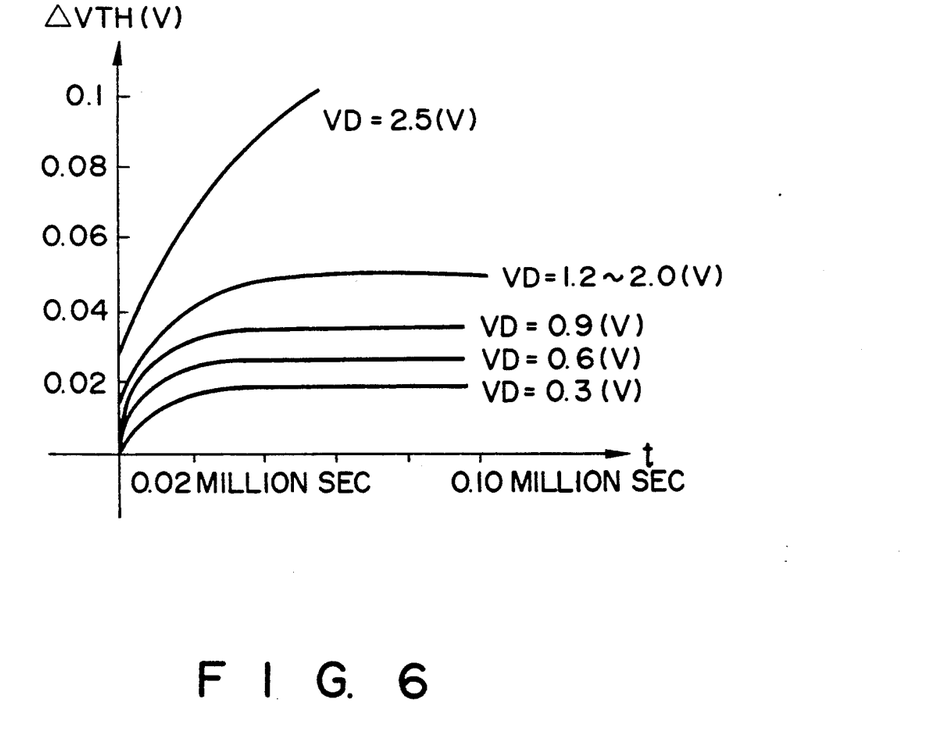
FIGS. 6 to 8 are graphs for explaining the first embodiment.
Figure 7:
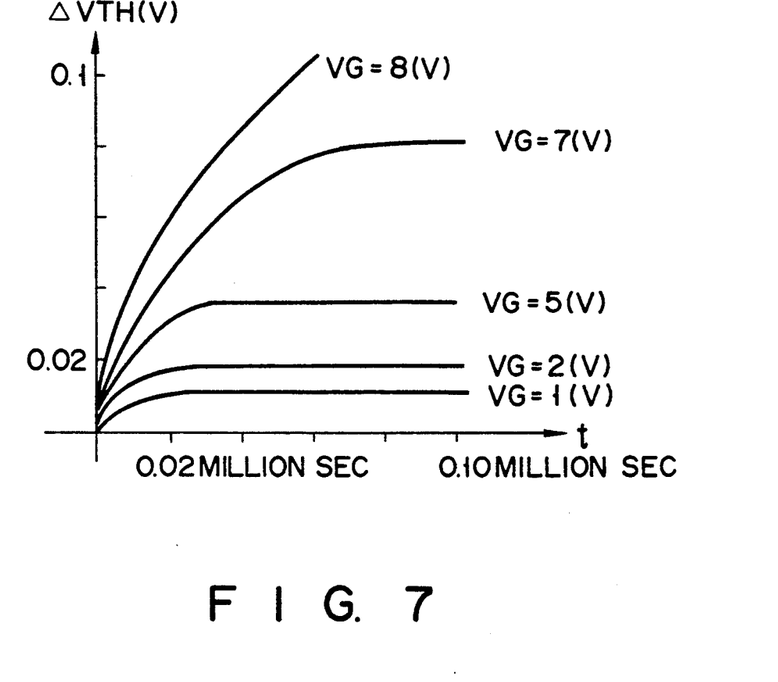

FIG. 6 is a graph showing a result obtained by measuring a change in threshold voltage, when the control gate voltage VCG of 7 V and the source voltage VS of 0 V are applied to each of the memory cells MC, the drain voltage VD is changed to various values, and each memory cell is left still for a long period of time. In FIG. 6, a change $\Delta$VTH (V) in threshold voltage is plotted along the abscissa and time t is plotted along the ordinate. Similarly, FIG. 7 is a graph showing a result obtained by measuring a change in threshold voltage, using the control gate voltage VCG as a parameter, after the memory cell stands still for a long period of time. This measurement is performed when the source voltage VS of 0 V and the drain voltage VD of 2 V are applied to each of the memory cells. In FIG. 7, a change $\Delta$VTH (V) in threshold value is plotted along the abscissa, and time t is plotted along the ordinate.

Figure 8:
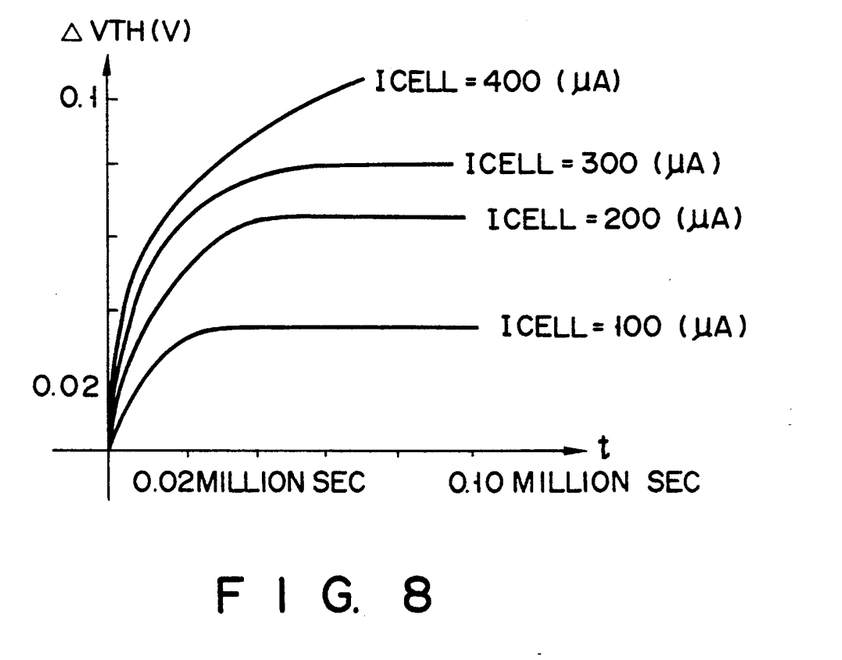

FIG. 8 is a graph showing a result obtained by measuring a change in threshold voltage, using an ON memory cell current Icell as a parameter, after the memory cell stands still for a long period of time. This measurement is performed when the source voltage VS of 0 V and the control gate voltage VCG of 7 V are applied to each of the memory cells. In FIG. 8, a change ΔVTH (V) in threshold value is plotted along the abscissa, and time t is plotted along the ordinate.

As is apparent from FIG. 6, the change ΔVTH is almost constant independent of the value of the drain voltage VD when the drain voltage VD falls within the range of 1.2 to 2.0 V. This phenomenon cannot be explained in the hot electron mode. That is, as shown in characteristics curves in FIG. 3, since the current converting amount IG depends on the drain voltage VD, the change ΔVTH must not be constant when the drain voltage VD is changed. However, the characteristic curves shown in FIG. 6 can be obtained for the following reason. When the the value of the drain voltage VD falls within the range of 0.3 to 0.9 V, the value of the memory cell current Icell is increased according to an increase in drain voltage VD. When the drain voltage VD falls within the range of 1.2 to 2.0 V, the value of the memory cell current Icell is not changed even when the value of the drain voltage VD is increased. As shown in the characteristic curves in FIG. 3, when the control gate voltage VG is 5 V or more, a change in threshold voltage must be decreased in the hot electron mode since the current conversion amount IG of hot electrons is smaller than the peak value. However, as shown in FIG. 7, when the control gate voltage VG is 5 V or more, the change in threshold voltage is increased proportionally to an increase in the control gate voltage VG. As has been described above, therefore, the change in threshold value which occurs when the drain voltage VD falls within the range of 0 to 2.0 V seems to be associated with electrons in the lucky electron mode.

As apparent from FIG. 8, in order to control the change ΔVTH in threshold value to be 0.1 V or less, the value of the memory cell current Icell is set to 300 μA or less when the control gate voltage VG is 7 V. When characteristic curves in FIG. 7 and the lucky electron mode are considered, the value of the voltage VG of less than 7 V causes a decrease in the change ΔVTH, thereby improving characteristics of the change ΔVTH, Therefore, when a voltage of about 2.0 V is applied to the drain of the memory cell and constants of each memory cell are set to supply a current of 300 μA or less to each memory cell during the ON time in data read access, the change in threshold voltage can be prevented not only in the hot electron mode but in the lucky electron mode. Thus, occurrence of soft write can be reduced compared with the prior art.

Figure 9:
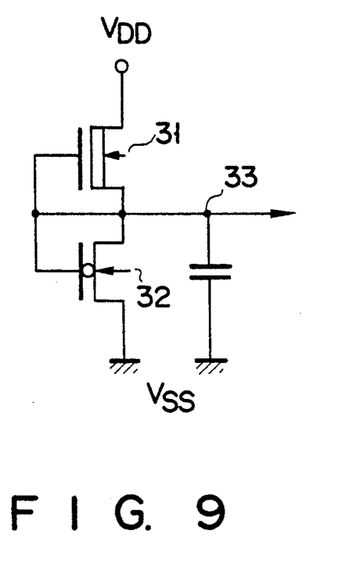
FIGS. 9 and 10 are circuit diagrams of a constant-voltage circuit used in the embodiment.
Figure 10:
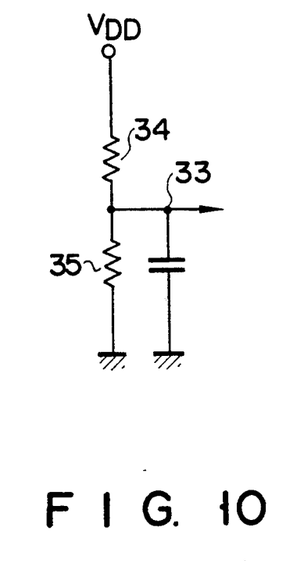

During reading data from a memory cell, a constant voltage of about 2 V output from the column decoder 24 is generated from a constant-voltage circuit shown in FIGS. 9 or 10. The column decoder 24 selectively supplies a constant voltage of about 2 V generated by the constant-voltage circuit to the gate of the column selection MOS transistor 22 in response to column address input signals (not shown).

The constant-voltage circuit in FIG. 9 comprises a depression type MOS transistor 31 and an intrinsic type (I type) MOS transistor 32 having a threshold value of about 0 V connected in series between the external power source voltage VDD and the ground voltage VSS of 0 V. The gates of both the transistors 31 and 32 are commonly connected to a node 33 from which the constant voltage of about 2 V can be obtained.

The circuit in FIG. 10 comprises two resistors 34 and 35 connected between the external power source voltage VDD and the ground voltage VSS.

Figure 11:
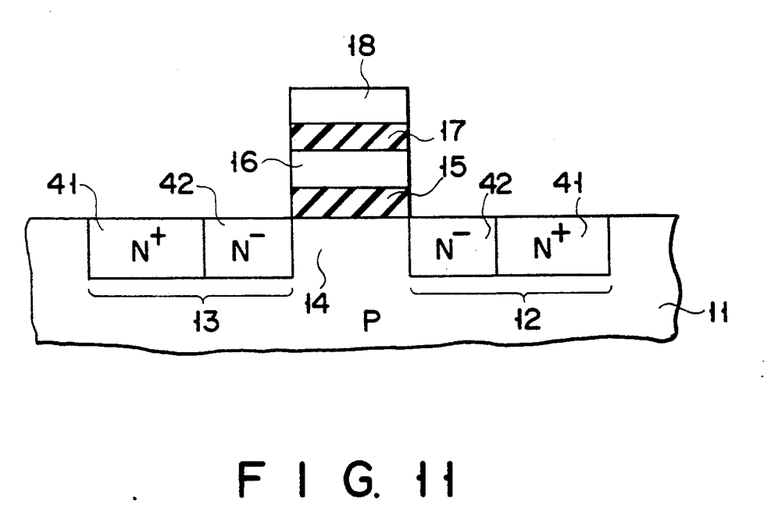
FIG. 11 is a sectional view showing another memory cell used in the circuit according to the first embodiment.

In a case wherein the constant-voltage circuit must be used due to circuit limitations, when the power source voltage VDD is increased, the drain voltage VD of the memory cell is increased. Therefore, when the constant-voltage circuit in FIG. 10 is used, a memory cell having a so-called LDD structure, as shown in FIG. 11, must be used. In the memory cell, a high-impurity concentration N+-type drain region 41 and a low-impurity concentration N−-type drain region 42 are used as the source drain regions 12 and 13. Since use of the memory cell having the LDD structure is equal to the state wherein a resistor is connected to the drain of the memory cell, a voltage drops across the resistor, thereby reducing the drain voltage of the memory cell.

Note that the present invention is not limited to the above embodiment, various modifications can be made. For example; a memory cell having the above constants is normally used in an EPROM having a 1-Mbit capacity. In short, any memory cell having constants which are set so that the value of the memory cell current during the ON time is 300 μA or less can be used. For example, in a memory cell used in an EPROM having a 4-Mbit capacity, the thickness of the first gate oxide film 15 is set to 200 Å, a coupling ratio of the floating gate to the control gate is set to 2, the channel length L is set to 0.9 μm, and the channel width W is set to 0.8 μm. The memory cell current of the memory cell can be set at about 80 μA.

In addition, in a memory cell used in an EPROM having a 16-Mbit capacity, the thickness of the first gate oxide film 15 is set to 150 Å, a coupling ratio of the floating gate to control gate is set to 2, and each of the channel length L and the channel width W is set to 0.6 μm. Therefore, the memory cell current of the memory cell can be set to about 50 μA.

Figure 12:
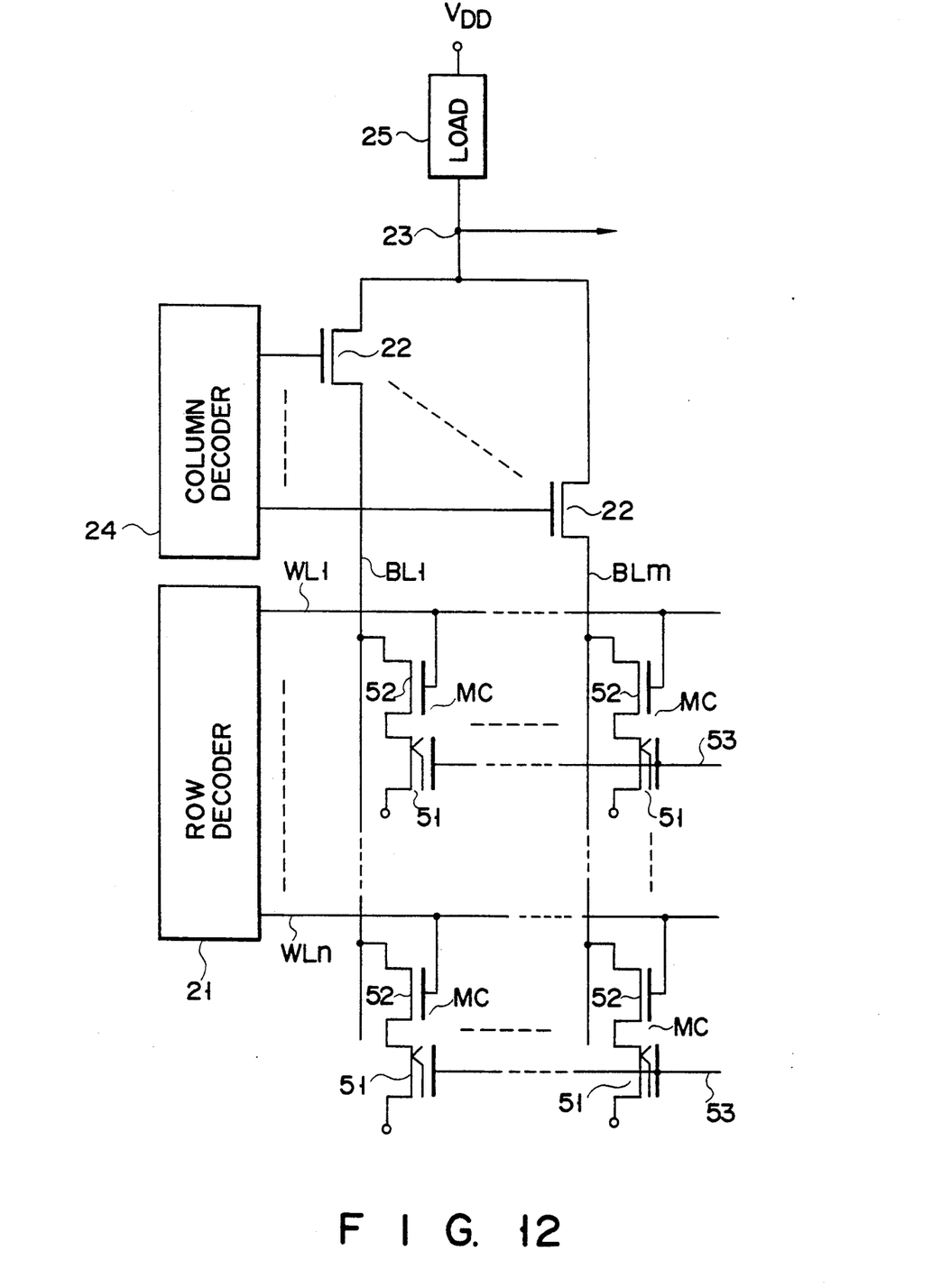
FIG. 12 is a circuit diagram showing a circuit according to a second embodiment of the present invention.

In the above embodiment, a case wherein the present invention is applied to an EPROM has been described. However, the present invention can be applied to an E²PROM having a selection transistor in its memory cell. FIG. 12 is a diagram showing a circuit arrangement of a data read circuit when the present invention is applied to an E²PROM. Note that data write circuit is omitted in FIG. 12. The same reference numerals in FIG. 12 denote same parts as in FIG. 4, and an explanation of the parts is omitted. This embodiment is different from that in FIG. 4 in that each memory cell MC comprises a data memory MOS transistor 51 constituted by a non-volatile transistor having a floating gate and a selection MOS transistor 52 which are connected in series with each other. The control gate of the data memory MOS transistor 51 in each of a plurality of memory cells is connected to a data writing control line 53 of each row line.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A non-volatile semiconductor memory device comprising:

a memory cell constituted by a non-volatile transistor having a source region and a drain region, a channel region located between said source and drain regions, a first insulating film formed in said channel region, a floating gate formed on said first gate insulating film, a second gate insulating film formed on said floating gate, and a control gate formed on said second gate insulating film, said channel region having a length of less than or equal to 1 μm;

first circuit means for receiving an external power source voltage of not less than 2 V, for decreasing the external power source voltage to obtain a voltage of not more than 2 V and for applying the voltage of not more than 2 V to said drain region of said memory cell when reading data from said memory cell;

second circuit means for applying a predetermined read voltage to said control gate when reading data from said memory cell; and control means for controlling soft write in said non-volatile transistor in a lucky electron mode by limiting a current flowing between the course region and drain region to less than or equal to 300 μA when said voltage of not more than 2 V is applied to said drain region of said non-voltage transistor and the predetermined read voltage output from said second circuit means is applied to the control gate.

2. A device according to claim 1, wherein said control means controls the occurrence of soft write in accordance with a ratio of a channel width (W) and a length L of said non-volatile transistor, a thickness of said first gate insulating film, and a threshold voltage of said non-volatile transistor.

3. A device according to claim 1, wherein said memory cell is an EPROM cell.

4. A device according to claim 1, wherein said memory cell is a E²PROM cell.

5. A device according to claim 1, wherein said memory cell is an EPROM cell having a channel length of 0.8 μm.

6. A device according to claim 1, wherein said memory cell is an EPROM cell having a channel length of 0.6 μm.

7. A device according to claim 1, wherein said first circuit means comprises:

a column decoder having a constant-voltage circuit for obtaining the voltage of not more than 2 V from the external power source voltage of not less than 2 V, and a column selection MOS transistor which is connected in series with said memory cell, a gate of which is supplied with a output from said column decoder.

8. A device according to claim 7, wherein said constant-voltage circuit comprises:

an external power source voltage supplying node, a constant-voltage output node for obtaining the voltage of not more than 2 V, a ground voltage supplying node, a first depression MOS transistor, source and drain regions of which are connected between said external power source voltage supplying node and said constant voltage output node and a gate of which is connected to said constant-voltage output node, and a second intrinsic MOS transistor, source and drain regions of which are connected between said constant-voltage output node and said ground voltage supplying node and a gate of which is connected to said constant-voltage output node.

9. A device according to claim 7, wherein said constant-voltage circuit comprises:

an external power source voltage supplying node, a constant-voltage output node for obtaining the voltage of not more than 2 V, a ground voltage supplying node, a first resistor element connected between said external power source voltage supplying node and said constant-voltage output node, and a second resistor element connected between said constant-voltage output node and said ground voltage supplying node.

10. A device according to claim 1, wherein said second circuit means is a row decoder.

* * * * *

UNITED STATES PATENT AND TRADEMARK OFFICE
CERTIFICATE OF CORRECTION

PATENT NO. : 5,241,498
DATED : August 31, 1993
INVENTOR(S) : Seiichiro Yokokura

It is certified that error appears in the above-indentified patent and that said Letters Patent is hereby corrected as shown below:

Title page: after Other Publications
Assistant Examiner, front page, change "Zarahian" to --Zarabian--.

Claim 4, column 7, line 42, change "a $E^2$PROM" to --an $E^2$PROM--.

Claim 7, column 8, line 12, change "a output" to --an output--.

Signed and Sealed this

Twenty-third Day of August, 1994

Attest:

BRUCE LEHMAN

Attesting Officer  Commissioner of Patents and Trademarks